United States Patent [19]
Bonyhard et al.

[11] 4,020,476
[45] Apr. 26, 1977

[54] MAGNETIC BUBBLE MEMORIES WITH NONOBSTRUCTING CROSSINGS BETWEEN CONDUCTOR AND PERMALLOY PATTERNS

[75] Inventors: Peter Istvan Bonyhard, Edison; James Lanson Smith, Bedminster, both of N.J.

[73] Assignee: Bell Telephone Laboratories, Incorporated, Murray Hill, N.J.

[22] Filed: Feb. 4, 1976

[21] Appl. No.: 655,257

[52] U.S. Cl. .................................. 340/174 TF
[51] Int. Cl.[2] .................................. G11C 19/08
[58] Field of Search .................... 340/174 TF

[56] References Cited
OTHER PUBLICATIONS

A.I.P. Conference Proceedings, No. 18, Part I; 3M Conference, 1973, pp. 100–104.

A.I.P. Conference Proceedings, Magnetism & Magnetic Materials, No. 24; 1974, pp. 641–642.

*Primary Examiner*—James W. Moffitt
*Attorney, Agent, or Firm*—Herbert M. Shapiro

[57] ABSTRACT

A field-access magnetic bubble memory employs both a pattern of magnetic elements to define paths along which bubbles move in reponse to a magnetic field reorienting in the plane of bubble movement and electrical conductors which, inter alia, control bubble movement between paths. The crossings between the pattern of conductors and the pattern of magnetic elements have been found to be only negligibly disruptive of bubble movement if the conductors are carefully oriented with respect to the magnetic elements.

10 Claims, 9 Drawing Figures

MAGNETIC BUBBLE MEMORIES WITH NONOBSTRUCTING CROSSINGS BETWEEN CONDUCTOR AND PERMALLOY PATTERNS

FIELD OF THE INVENTION

This invention relates to magnetic bubble memories.

BACKGROUND OF THE INVENTION

Magnetic bubble memories are well known in the art. The most familiar type of bubble memory is one in which a pattern of magnetic elements is formed adjacent the surface of a film in which the bubbles are moved. The elements are designed such that repetitive patterns of magnetic poles move along channels defined by the elements in response to a magnetic drive field reorienting in the plane of bubble movement. The elements, generally, are composed of magnetically soft permalloy and have T and bar shapes in the most familiar prior art circuits.

A magnetic bubble appears as a disk when observed under a microscope through an analyzer in the presence of polarized light as is well known. The diameter of the disk in a given material is determined by a bias field antiparallel to the magnetization of the bubble. Typically, an epitaxially grown garnet film defines the plane of bubble movement and the magnetization of the film is normal to the plane. Thus, the bias field also is oriented normal to the plane of bubble movement in a direction antiparallel to the magnetization of the bubble. The reorienting (typically rotating) magnetic in-plane field can be understood to generate pole patterns in the permalloy elements. These pole patterns, in turn, modify the bias field locally causing similar patterns of magnetic field gradients which result in bubble movement. Due to the fact that bubble movement is caused by a magnetic field rather than by an arrangement of electrical conductors, and due to the fact that the permalloy elements are operative to move those bubbles to a detector for accessing sequentially information represented by the bubble pattern, this form of bubble memory is commonly called a "field-access" (or field-accessed) bubble memory.

A field-access bubble memory is commonly organized in a "major-minor" configuration. The term major-minor describes an organization for the pattern of permalloy elements which defines a plurality of closed loop paths, or minor loops, about which bubble patterns move in parallel, and an accessing path called the major path. The plurality of minor loops is operative as a permanent store. Information in the form of bubble patterns is moved from he minor loops to the major path at a reference position (or stage) defined at a turn element in each minor loop. To this end, an interchannel bubble movement-controlling permalloy pattern is formed between the turn element in each loop and an associated stage of the major path. An electrical conductor couples the turn elements of the various loops, electrically in series, causing the information, represented by the bubble pattern, to be moved in parallel to the major path when the conductor is pulsed.

The information (viz: bubble pattern) can be moved between channels in a variety of modes. In one of these modes, bubble transfer occurs. In this mode, a permalloy pattern defines a bubble transfer function operative in response to a signal in a cooperating transfer conductor to move information from the reference positions in the minor loops to the major path leaving vacancies at the reference positions. In this type of bubble memory, the major path is in the form of a closed loop also and the number of stages in the major loop is related to the number in each minor loop such that as the in-plane field continues to rotate, the transferred information and the vacancies from which the information originated move about the various paths and arrive at the transfer positions simultaneously. A second signal on the transfer conductor is operative to restore the transferred information to the originating positions.

An alternative mode of operation for bubble memories results when the permalloy pattern defines a plurality of bubble replicators. A bubble replicator is composed of a permalloy pattern at which an image of the bubble pattern (in the reference positions in the minor loops for example) is produced in the accessing path. Again, an electrical conductor couples the permalloy pattern electrically in series for controlling the replication. This form of bubble memory has the virtue that image information need not be returned to the originating vacancies, thus leading to faster cycle times.

In still another mode of operation, the permalloy pattern defines a swap function. In this mode, newly written information is exchanged at reference positions with selected information previously stored in the minor loops. Once again the operation is controlled typically by a pulsed conductor over which a permalloy pattern is formed. The transfer, swap, and replicate functions are just examples of the many special functions employed in the operation of a field-access bubble memory. Other examples are generation, annihilation, etc.

Each one of these functions presently requires the presence of a conductor pattern of one configuration and a permalloy pattern of another configuration. Where the two patterns differ (that is where they cross one another as is the usual case), a step coverage problem may exist. Because the permalloy pattern is typically formed last, the step coverage problem results in steps in the permalloy and in a permalloy pattern which is formed in more than one plane.

These steps can lead to restraints in the movement of bubbles in the layer of bubble material. The restraints have been found to be due to the effect of the in-plane field on the permalloy between two steps where a thinning of the permalloy commonly occurs. The permalloy pattern itself is in a plane normal to the direction of the bias field and parallel to that of the in-plane field. Thus the former has no effect on the permalloy pattern and the latter normally produces poles at the extremes of each element in a flux path therein aligned with the field. But, where a step occurs at an element, permalloy at the step is relatively thin. This thinning of the permalloy may give rise to pole configurations with significant separation (flux paths) between steps for providing a long path to one side of the step and a short path to the other. A net disruptive pole configuration frequently occurs and constitutes an impediment to bubble movement.

BRIEF DESCRIPTION OF THE INVENTION

The invention is based on the recognition that steps in the permalloy layer may result in such undesirable pole configurations and that the conductor and permalloy patterns can be arranged such that steps occur only where and when poles generated there only negligibly affect the operation of the memory. In accordance with the present invention, the two patterns (conductor and permalloy) are designed to produce at a step the unwanted pole configurations only at times different from those at which a bubble arrives at the step so that only negligible hindrance to bubble movement results. Specifically, a conductor herein crosses a permalloy propagate element at an angle with respect to a normal to the propagation direction, the conductor being inclined in the direction of bubble propagation. This arrangement of crossings produces a desirable (propagation) pole with a maximum flux path through the permalloy overlying the conductor for propagating a domain and only negligible unwanted poles across the step due to step coverage (or strain) at the position occupied by the bubble when a bubble normally crosses the step. Often, the step occurs at a reference position on a turn element at which the bubble function, say a swap function, occurs. The conductor, in this instance, is oriented so that the rotating in-plane field is in a direction to move a bubble to the reference position for the function to take place at a time when only negligible unwanted poles are generated at the step. The orientation of the conductor to this end is of foremost importance for permalloy geometries of a disk shape most advantageously including asymmetric disk and asymmetric chevron structures disclosed in copending application Ser. No. 629,007 filed Nov. 5, 1975 for P. I. Bonyhard-J. L. Smith-Y. S. Chen.

DETAILED DESCRIPTION OF THE DRAWINGS

Figure 1:
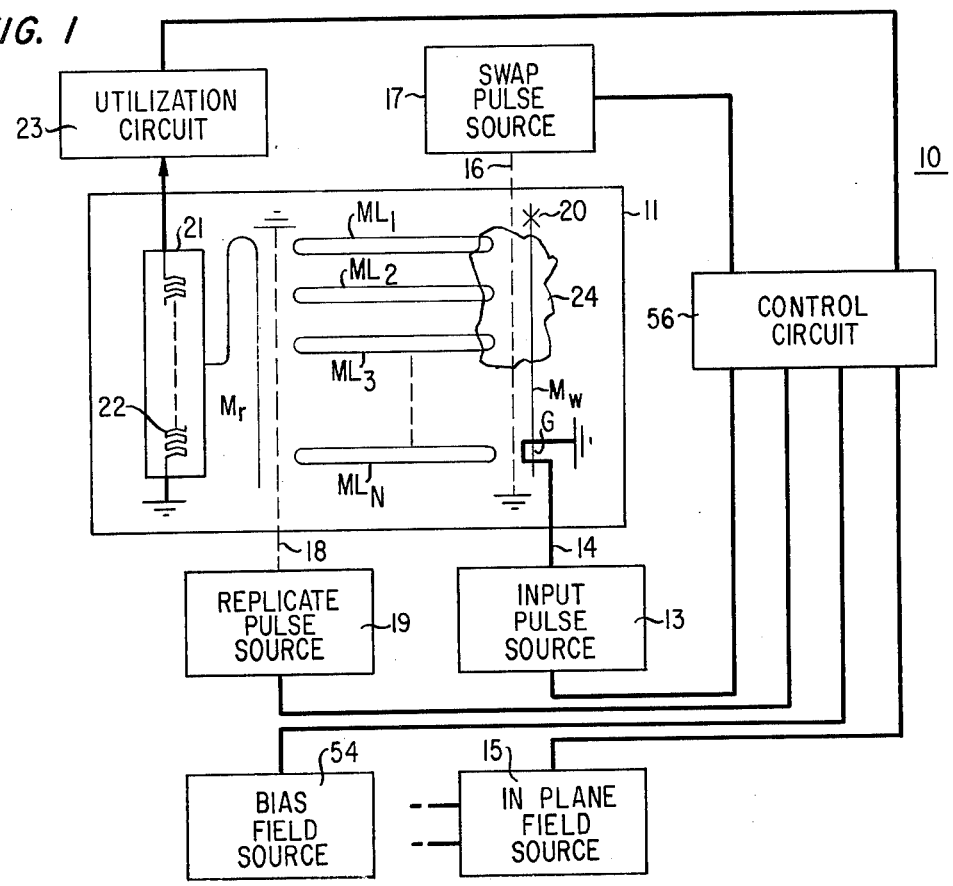
FIG. 1 is a schematic representation of an illustrative magnetic bubble memory.

FIG. 1 shows a magnetic bubble memory 10 including a layer 11 in which magnetic bubbles, representative of information, can be moved. The paths along which the bubbles move are defined by patterns of magnetically soft elements, typically permalloy, formed on layer 11 as is well known. The elements may take a variety of shapes such as T-bar, X, Y, chevron, disk and asymmetric disk or chevron shapes and are shown in FIGS. 2 through 8 herein as having asymmetric disk shapes. In FIG. 1, the paths are represented as lines. A typical major-minor organization is shown where closed lines $ML_1$, $ML_2$, ... $ML_N$ represent the minor loops and line $M_r$ represents the major path for the read operation. A second major path is designated $M_w$ for the provision of a write capability for the memory. Note that the write and read operations are conducted at opposite ends of the minor loops in the figure.

In the illustrative memory, a bubble pattern representative of information is generated in major write path $M_w$ at generator G. Specifically, during a write operation, an input pulse source represented by block 13, applies a (pulse or no pulse) input signal to conductor 14. This input signal occurs during each cycle of the in-plane drive field. The field is provided by an in-plane field source represented by block 15 and results in a bubble pattern in the write path at stages associated with the right ends of the minor loops as viewed in the figure. The bubble pattern is moved to positions in the minor loops illustratively by a swap of information with that in the minor loop. The swap operation occurs in response to a swap pulse applied to conductor 16 by a swap pulse source represented by block 17 in the figure. The new information is stored in the minor loops while the old information moves in path $M_w$, upwards as viewed, for annihilation at 20. A major-minor bubble memory including a swap function is disclosed in copending application, Ser No. 629,007 filed Nov. 5, 1975 for P. I. Bonyhard-J. L. Smith-Y. S. Chen.

Information stored in this manner during successive write operations maintains full occupancy of the minor loops. A selected bubble pattern representative of information in the minor loops is moved to the left end of the minor loops to positions at which the information is (illustratively) replicated into the read major path during a read operation by the application of a replicate pulse to conductor 18 by source 19. In response to continued rotation of the in-plane field, the so-replicated pattern moves in path $M_r$ to an expansion detector 21 including a magnetoresistive detector 22. Detector 22 is connected between ground and a utilization circuit represented by block 23. Thus, in the illustrative memory, newly written data replaces previously stored data by a swap operation at a "write" end of the minor loops and a read operation is preceded by replication from the minor loops at the other end.

The swap between a selected bubble pattern in the minor loops and new information occurs when a "swap" pulse is applied to conductor 16. The conductor may be seen to lie between the right ends of the minor loops and the write major loop. In practice, conductor 16 along with all the conductors required for operation herein are deposited by photolithographic techniques on the coated surface of layer 11. The conductor pattern is then coated with an insulating layer and the permalloy pattern is formed thereon. It is the crossings between the conductor and permalloy patterns which give rise to the problem of disruptive pole configurations and are reduced to negligible proportions by the practice of this invention. We will now focus on the site of the swap function and consider the illustrative conductor and permalloy patterns which achieve that reduction for that function in accordance with this invention.

Consider area 24 of FIG. 1 where minor loop $ML_2$ and major path $M_w$ come into close proximity. The conductor and permalloy patterns in this area are shown in detail in FIG. 2. The turn element 25 of minor loop $ML_2$, for example, can be seen to cover hairpin portion 26 of conductor 16. FIGS. 3 through 8 show the movement of a bubble pattern with respect to turn element 25 and the periodic generation of pole configurations at a representative crossing between the conductor 16 and element 25 where a step in the plane of the permalloy occurs.

A bubble (or no bubble) representative of information moves clockwise in the minor loops for permalloy elements of the shape shown. The in-plane field also is rotating clockwise as indicated by the curved arrow in FIG. 3.

Figure 2:
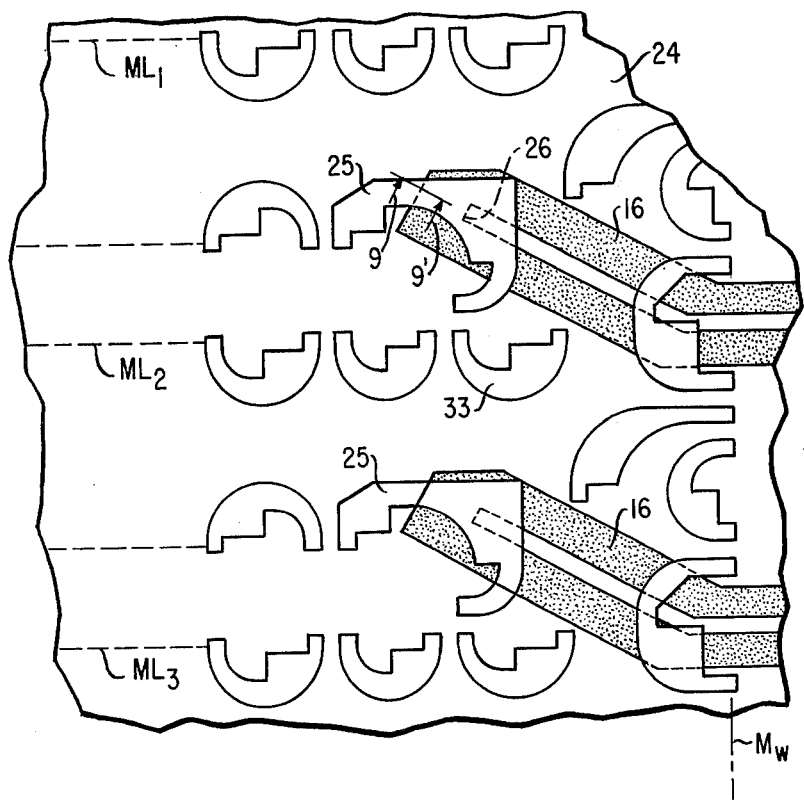
FIGS. 2 through 8 are top views of representative portions of the memory of FIG. 1 showing conductor as ell well permalloy patterns for the portions with bubble positions therein during operation.
Figure 3:
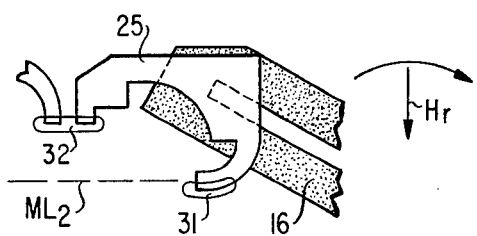

Consecutive bits of information in minor loop $ML_2$ are represented by oval indications in assumed initial positions 31 and 32 in FIG. 3 for an initial downward orientation of the in-plane field as represented by arrow $H_r$. The bit at position 32 is moving into position for a swap operation as the bit in position 31 moves to the left along the lower leg of loop $ML_2$ of FIG. 2.

Figure 4:
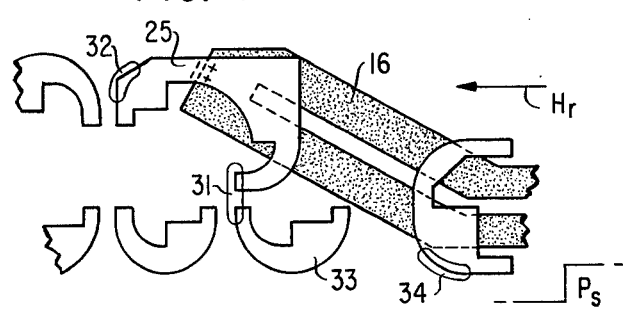
Figure 5:
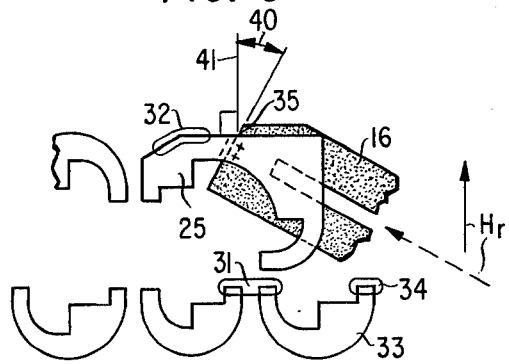

Arrow $H_r$ reorients to the left as viewed in FIG. 4 for moving bits 31 and 32 into the positions shown in that figure, bit 31 elongating to encompass the left tip of element 33 in FIGS. 2 and 4. A bit 34 in the write major path is positioned as shown in FIG. 4 for the swap with bit 32. Bit 32 moves upward along element 25 as the field next reorients to an upward direction as indicated in FIG. 5. Bit 31 moves to element 33 as shown in that figure.

Figure 6:
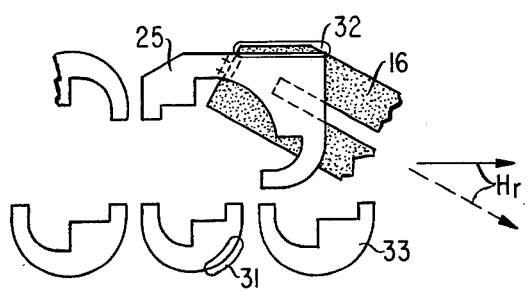
Figure 7:
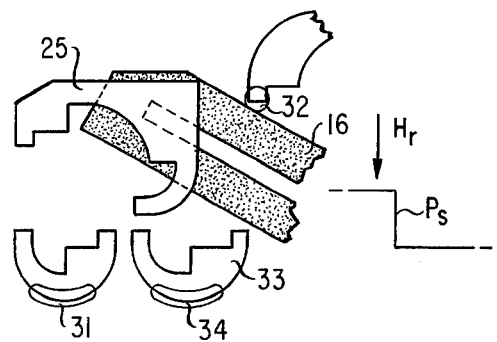
Figure 8:
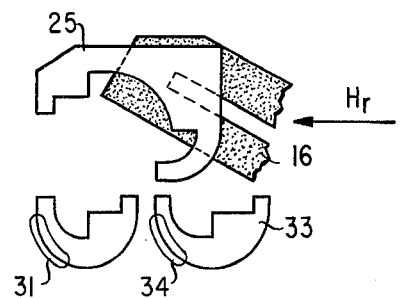

As the in-plane field reorients clockwise, bit 32 moves towards a reference position 35 as shown in FIG. 5. The actual swap of information is explained fully in the above-mentioned copending application and is not explained further herein. What is important herein is the configuration of the permalloy step and its effect on bubble movement. The particular organization shown is merely to provide a context for a full understanding of the significance of that effect. Suffice it to say at this juncture that a swap pulse $P_s$ is initiated when the field $H_r$ orients to the left as shown in FIG. 4, continues when the field next reorients upwards and then to the right as shown in FIGS. 5 and 6, and terminates when the field orients downward as shown in FIG. 7. The pulse is operative to move bits 32 and 34 to the positions shown in FIGS. 7 and 8.

What is particularly important in accordance with this invention is that at a step in the permalloy a bit may encounter an excess of unwanted poles because of the disparity in the lengths of flux paths aligned with the field that moves a bubble to the step. For a representative step at position 35 of FIG. 5, bit 32 may encounter a line of unwanted poles along the outside edge of the hairpin of conductor 16 as indicated by the plus signs in FIGS. 4 and 5. These poles are generated as the in-plane field reorients from the direction shown in FIG. 4 to that shown in FIG. 5. We will adopt the convention that minus poles repel bubbles, a convention consistent with a bubble magnetization upwards in layer 11 of FIG. 2 towards the viewer. The orientation of the in-plane field for which the unwanted pole strength is greatest is indicated by broken arrow $H_r$ in FIG. 5 because for this alignment the flux paths in the permalloy (element 25) aligned with the direction of the field have the greatest disparity in lengths.

The basic desire is to eliminate these unwanted poles or at least to reduce the effect those poles have on a bubble passing the step. One can imagine that a bubble inhibited from passing the step by those poles becomes out of synchronization with the field, thus altering the information content of the bubble pattern. The elimination of the unwanted poles by ensuring equal length flux paths through the permalloy at the time a bubble crosses a step appears to be unrealizable because of the constraints that criterion imposes on circuit design. But, the reorientation of the step with respect to the bubble path ensures that the unwanted poles can be made to appear both before and after the movement of a bubble to the step and not at the time of the bubble's arrival at the step.

The timing of the appearance of the unwanted poles with respect to the time of arrival of a bit at the representative step may be fully appreciated from an inspection of FIGS. 4 through 6. In FIG. 4, the unwanted poles are present and strengthening, but bit 32 has not as yet arrived at the step. When the field reorients to the position shown in FIG. 5, the unwanted poles are at maximum intensity and beginning to decrease in strength. The bit is just arriving at the step. As the field reorients to the direction shown in FIG. 5, the bit passes the conductor edge at a time when the unwanted poles have disappeared. When the field next aligns to the direction shown first by the broken arrow $H_r$ in FIG. 6 and then by the solid arrow, poles reoccur but the bit has already passed the conductor edge.

It should be clearly understood that in order to accomplish a function such as swap, replication or transfer of a bubble in a bubble memory utilizing both permalloy patterns for bubble movement and a conductor pattern for function control where the permalloy pattern lies on top of the conductor pattern, a step in the permalloy pattern occurs at a reference position where the function (i.e., swap) occurs. Consequently, by orientating the two patterns correctly with respect to one another in accordance with this invention, the unwanted poles which may develop along the step occur at a time, in each cycle of the in-plane field, when the bubble is not at the reference position. The illustrative circuit shows the patterns aligned so that the poles occur prior and subsequent to the movement of a bubble to the reference position. That is to say, the conductor 16 is oriented at an angle 40 to a normal 41 to the bit path of the element edge as shown in FIG. 5. The result is that the unwanted poles are out of phase with the arrival of a bit at the step.

Where the bit is a binary zero (no bubble), of course, no swap actually occurs in response to pulse $P_s$ of FIGS. 4-7. The unwanted poles also are of no consequence in this instance.

Figure 9:
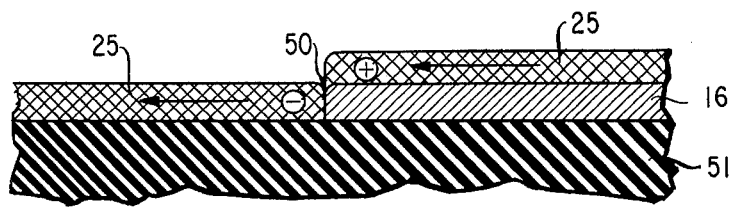
FIG. 9 shows a cross-section view of a representative step which may occur in a permalloy pattern along with the important pole configurations therein.

FIG. 9 shows a cross-section view of conductor 16 and a turn element 25 for a representative loop $ML_2$ taken along line 9-9' as shown in FIG. 2. The step in the permalloy layer at 50 (shown actually broken) occurs normally during the deposition of the permalloy pattern. When the in-plane field aligns in the direction indicated by broken arrow $H_r$ in FIG. 5, the flux path in element 25 aligned with that field is nonuniform at the step resulting in the production of poles of different polarities at strengths determined by the lengths of the aligned flux paths in the element. The matter is aggravated by the fact that different steps have different kinds of variations from a case where different steps in the path are of different thicknesses due to the insulating underlayment 51 or to the permalloy or both to a case where the permalloy is actually discontinuous as depicted in FIG. 9 at 50.

The problem of the unwanted poles is of particular interest also when a bubble is being moved into position for a swap operation and no swap operation is to occur. If the orientation of the conductor with respect to the permalloy pattern is such that the step is normal to the propagation path (the periphery of the disk) as is the case with prior art elements, the unwanted poles can cause a lag in the bubble position with respect to the field and thus in an alteration of the information stream as mentioned herein before. In the case where a swap is to occur, the unwanted poles may prevent the proper positioning of the bit for the swap operation.

The problem, of course, exists even in areas where no special function is to be carried out. For example, whenever a conductor is used to control a bubble function, the conductor is brought out to the edge of the bubble layer where external connection can be made to it. It is virtually impossible, in most instances, for the conductor to avoid intersecting other permalloy elements at which no function is to be performed at all. All that is required is that the step which occurs at the intersection be defined so that poles are generated there at a time different from that at which a bubble crosses the intersection. That is to say, the conductor crosses the permalloy at an angle to the normal to the propagation path of the permalloy element. For the crossing of any conductor and permalloy pattern which causes a step in the permalloy pattern, this angular relationship avoids deleterious effects of the unwanted pole configuration.

We have now discussed the origin and avoidance of disruptive pole configurations in terms of asymmetric disk elements in a field-access bubble memory. As was mentioned hereinbefore, a variety of different elements can be used to advantage with the angled conductor orientation. But, previously, elements with substantial flux paths defined therein, such as occur with disk-type elements, benefit the most. Elements such as T-bar, Y-bar and chevrons have not been made hitherto with a circuit period and bubble size small enough so that the unwanted poles at steps in the permalloy were anything more than second-order effects. For relatively large circuits and periods of, for example, 28 microns, such elements exhibit relatively large bubble diameter (7 microns) so that unwanted poles due to the step are negligible. Present photolithographic resolution capabilities make unattractive the practical realization of small period (16 microns) T-bar circuits, for example, where step coverage problems might be noticeable. Half-disk elements of such a small size (14 microns and smaller) are realizable at the present time.

As is shown in FIG. 2 and indicated in FIG. 1, conductor 16 couples an element 25 in each minor loop and is operative to produce a swap of the bubble pattern at the turn elements when the swap signal ($P_s$ of FIG. 4) is applied. The pattern moved to path $M_w$ is annihilated as indicated by cross 20 in FIG. 1 typically by movement into a guard rail structure which is well known in the art. As was stated hereinbefore, a bias field antiparallel to the magnetization of a bubble is uniformly present in layer 11 for maintaining the bubbles at a nominal operating diameter. Such a field is typically provided by a permanent magnet represented by block 54 of FIG. 1.

Circuit 23 and sources 13, 15, 17, 19, and 54 are activated and synchronized by a control circuit represented by block 56 in FIG. 1.

The various circuits and sources may be any such elements capable of operating in accordance with this invention.

What has been described is considered merely illustrative of the principles of this invention. Therefore, various embodiments thereof can be devised by those skilled in the art in accordance with those principles within the spirit and scope of this invention as claimed in the following claims.

What is claimed is:

1. A magnetic bubble memory comprising a layer of material in which magnetic bubble patterns representative of information can be moved, a first pattern of electrical conducting material overlaying said layer, a second pattern of magnetically soft elements overlying said conductor pattern and defining a first path along which said bubble patterns move in response to a magnetic field reorienting cyclically in the plane of said layer, said path including a reference position to which a bubble is moved when said in-plane field is oriented in about a first direction, said first and second patterns defining a crossing at said reference position at which magnetic poles inhibitive of the movement of said bubble occur, said first and second patterns having geometries such that said reference position is occupied by a bubble at a time different from that at which said poles occur during each of said cycles.

2. A memory in accordance with claim 1 wherein said patterns have geometries so that said poles occur and are extinguished prior to the movement of a bubble to said reference position during a cycle of said in-plane field.

3. A memory in accordance with claim 2 wherein said second pattern comprises permalloy elements.

4. A memory in accordance with claim 3 wherein said permalloy elements also define a second path and said first path comprises a closed loop path for circulating bubbles thereabout.

5. A memory in accordance with claim 4 including a plurality of closed loop first paths defined by said permalloy elements and said second path includes a plurality of stages different ones of which come into close proximity with an associated one of said first paths, each of said first paths including a turn element defining a said reference position.

6. A memory in accordance with claim 5 wherein said first pattern comprises an electrical conductor coupled electrically in series to said turn elements for moving bubbles from said reference positions to said second path when a signal is applied to said conductors at a time said in-plane field is in a first direction for moving bubbles to said reference positions.

7. A memory in accordance with claim 6 wherein said conductor includes a hairpin-shaped turn associated with each of said turn elements and said turn elements are formed on top of said conductor resulting in steps in said turn elements at crossings therebetween.

8. A memory in accordance with claim 7 wherein said permalloy elements are generally of asymmetric disk or chevron shape.

9. A bubble memory comprising a layer of material in which magnetic bubbles can be moved and a first pattern of magnetically soft elements for defining a first and a plurality of second closed loop paths for movement of bubbles in a first direction therein in response to a magnetic field rotating in the plane of said layer, said paths lying in close proximity at a reference position to which bubbles are moved when said field lies in a first orientation, a second pattern of electrically conducting material, said second pattern being of a geometry to define a controllable bubble operation at said reference positions and being adapted for controlling said operation when pulsed, said second pattern causing steps in said first pattern at said reference positions, said steps exhibiting unwanted and transient repelling magnetic poles during each cycle of said rotating field, said first and second pattern having geometries such that transient unwanted magnetic poles occur during each cycle of said rotating field only when said bubbles do not occupy said reference positions.

10. A bubble memory in accordance with claim 9 wherein said first pattern comprises a plurality of generaly asymmetric disk or chevron elements.

* * * * *